United States Patent
Sugihara

(10) Patent No.: US 10,483,134 B2
(45) Date of Patent: Nov. 19, 2019

(54) SUBSTRATE TREATMENT DEVICE AND SUBSTRATE TREATMENT METHOD

(71) Applicant: J.E.T. Co., Ltd., Asakuchi-gun (JP)

(72) Inventor: Kazuo Sugihara, Asakuchi-gun (JP)

(73) Assignee: J.E.T. CO., LTD., Okayama (JP)

( * ) Notice: Subject to any disclaimer, the term of this patent is extended or adjusted under 35 U.S.C. 154(b) by 51 days.

(21) Appl. No.: 15/735,354

(22) PCT Filed: Jun. 7, 2016

(86) PCT No.: PCT/JP2016/066939
§ 371 (c)(1),
(2) Date: Dec. 11, 2017

(87) PCT Pub. No.: WO2016/199769
PCT Pub. Date: Dec. 15, 2016

(65) Prior Publication Data
US 2018/0174868 A1 Jun. 21, 2018

(30) Foreign Application Priority Data
Jun. 12, 2015 (KR) .................. 10-2015-0083297

(51) Int. Cl.
*H01L 21/67* (2006.01)
*B08B 1/04* (2006.01)
*H01L 21/02* (2006.01)

(52) U.S. Cl.
CPC .......... *H01L 21/67034* (2013.01); *B08B 1/04* (2013.01); *H01L 21/02057* (2013.01); *H01L 21/67051* (2013.01); *H01L 21/67207* (2013.01)

(58) Field of Classification Search
CPC combination set(s) only.
See application file for complete search history.

(56) References Cited

U.S. PATENT DOCUMENTS

2004/0163683 A1* 8/2004 Sugimoto ......... H01L 21/67034
134/56 R
2004/0211959 A1* 10/2004 Kajita ............... H01L 21/67051
257/48
(Continued)

FOREIGN PATENT DOCUMENTS

JP 3967677 B2 8/2007
JP 2007-273806 A 10/2007
(Continued)

OTHER PUBLICATIONS

International Search Report dated Jul. 19, 2016, issued for PCT/JP2016/066939.

*Primary Examiner* — Erin F Bergner
(74) *Attorney, Agent, or Firm* — Locke Lord LLP

(57) ABSTRACT

A substrate treatment device includes: a substrate holding unit including a plate-shaped holding table that rotatably holds a substrate so that a surface of the substrate on which the fine patterns are formed faces downward, and a plurality of holding pins provided on the holding table to hold an outer periphery of the substrate at a plurality of points; a heater that heats the substrate; a cover that internally houses the substrate holding unit and the heater, and forms a treatment chamber; a pump that exhausts the treatment chamber to make a negative-pressure atmosphere; an inert gas supply port that faces an opposite side surface opposite to the surface with the fine patterns formed thereon, and supplies inert gas into the treatment chamber; and a nozzle to jet a cleaning solution toward the surface with the fine patterns formed thereon and a gas exhaust port to communicate with the pump.

12 Claims, 7 Drawing Sheets

(56) References Cited

U.S. PATENT DOCUMENTS

| | | | |
|---|---|---|---|
| 2012/0080061 A1* | 4/2012 | Kim | F26B 5/005 |
| | | | 134/95.2 |
| 2012/0186744 A1* | 7/2012 | Higashijima | H01L 21/67051 |
| | | | 156/345.21 |
| 2014/0261554 A1 | 9/2014 | Hayashi et al. | |
| 2016/0276379 A1* | 9/2016 | Hamada | H01L 21/67115 |

FOREIGN PATENT DOCUMENTS

| | | |
|---|---|---|
| JP | 2012-156266 A | 8/2012 |
| JP | 2015-92530 A | 5/2015 |
| KR | 10-2009-0092927 A | 9/2009 |

\* cited by examiner

SUBSTRATE TREATMENT DEVICE AND SUBSTRATE TREATMENT METHOD

TECHNICAL FIELD

The present invention relates to a substrate cleaning and drying treatment device and method, in which a substrate such as a semiconductor wafer or a glass substrate for a flat-panel display device is cleaned or dried, and particularly to single-wafer type substrate treatment device and substrate treatment method for performing a cleaning and drying treatment for each substrate.

BACKGROUND ART

In general, a semiconductor device is manufactured by repeating a process of laminating (depositing) and patterning (etching) an insulating material, a semiconductor material, a conductive material such as metal, and the like on a wafer. A flat-panel display device such as a liquid crystal display device is also manufactured by repeating a process of laminating and patterning various kinds of materials on a glass substrate in a manner similar to the semiconductor device. In order to form one pattern layer and laminate another material thereon, the following process is usually performed before the laminating: a patterning dust or a by-product remaining on the wafer or the glass substrate (hereinafter simply referred to as "substrate"), or a residue of chemicals that are used in the patterning, impurities, or the like (hereinafter simply referred to as "foreign substance") is cleaned and removed and then the substrate is dried.

In the conventional case or in the case where the patterns are relatively simple and not fine, such a substrate cleaning and drying treatment is performed in a batch type in which a plurality of substrates is loaded in a cassette or a tray and processed at one time for the productivity and efficiency. On the other hand, in the case where the patterns are fine and arranged at narrow intervals or the aspect ratio of the patterns is large, a single-wafer type substrate treatment device is used in which the substrates are cleaned and dried one by one because in the batch type treatment, the foreign substance in the narrow and deep gap between the patterns cannot be eliminated completely. Examples of such a single-wafer type substrate treatment device include a device as described in Patent Literature 1. The device disclosed in Patent Literature 1 includes: a removing treatment unit that cleans the foreign substance on the substrate with a cleaning solution such as a chemical solution or pure water and shakes off the cleaning solution by rotating the substrate; and a drying treatment unit that is disposed adjacent to the removing treatment unit, receives the substrate cleaned by the removing treatment unit, and dries the cleaning solution remaining on the substrate.

In recent years, however, the patterns have become more fine and the conventional single-wafer type treatment device may fail to completely remove the foreign substance held in the narrow and deep gap between the patterns. For example, Patent Literature 2 discloses the flash memory element in which the patterns (the gate patterns where the floating gate, the dielectric film, the control gate, and the metal electrode layer are laminated) are arranged at intervals of just several to several tens of nanometers, and it is difficult for the single-wafer type treatment device to completely clean and dry the gap between such narrow patterns.

CITATION LIST

Patent Literature

Patent Literature 1: Japanese Patent No. 3967677
Patent Literature 2: Korean Unexamined Patent Publication No. 10-2009-0092927

SUMMARY OF INVENTION

Technical Problem

FIGS. 1a to 1c are cross-sectional diagrams illustrating a process of drying a substrate with fine patterns formed thereon. First, as illustrated in FIG. 1a, a substrate drying device (drying treatment unit) is disposed in a clean room in which clean air is usually supplied downward from the top (see the arrows A) and a slightly positive pressure is maintained, and includes a holding unit 20 that holds a substrate 10 and a heater that is incorporated in the holding unit 20 and heats the substrate.

The substrate 10 is cleaned by the substrate cleaning device (removing treatment unit) (not illustrated), and then the cleaning solution is shaken off from the substrate 10 by the rotation movement. Then, the substrate 10 is placed on the holding unit 20 so that a surface of the substrate 10 with the fine patterns 11 formed thereon faces upward. Next, the cleaning solution remaining on the substrate 10 is dried by heating the substrate 10 using the heater. In this drying, if the fine patterns 11 are arranged at very narrow intervals, the cleaning solution aggregates at an end of the fine patterns 11 due to the surface tension and thus, droplets 16 are formed, as illustrated in FIG. 1b. As described above, the clean room has the slightly positive-pressure atmosphere; therefore, as compared to the atmospheric pressure inside a space 12 which is formed by the droplet 16 and the adjacent fine patterns 11 with the droplet 16 serving as the boundary, the atmospheric pressure outside the space 12 (i.e., the clean room) becomes high. This state causes the droplet 16 to have the meniscus shape that is depressed to the inside of the space 12. As a result, it becomes difficult for the droplet 16 of the cleaning solution to get out of the space 12, that is, the gap between the fine patterns 11, and thus, the droplet 16 cannot be dried smoothly and completely. When the droplet 16 cannot be dried smoothly as above, the ends of the fine patterns 11 are attracted to each other due to the surface tension of the cleaning solution. Thus, the ends of the fine patterns 11 are attached to or separated from each other as illustrated in FIG. 1c, and the pattern failure occurs.

The present invention has been made in view of the above problem, and an object is to provide a substrate treatment device and a substrate treatment method, which can prevent the pattern failure on the substrate caused by the incomplete drying of the substrate and can perform the substrate cleaning and drying treatment with the smaller size, at the lower cost, and in a shorter time.

Solution to Problem

A substrate treatment device according to the present invention is a substrate treatment device for cleaning and drying a substrate with fine patterns formed thereon, the substrate treatment device including: a substrate holding unit including a plate-shaped holding table that rotatably holds the substrate so that a surface of the substrate with the fine patterns formed thereon faces downward, and a plurality of holding pins provided on the holding table to hold an outer periphery of the substrate at a plurality of points; a heater that heats the substrate; a cover that internally houses the substrate holding unit and the heater, and constitutes a treatment chamber; a pump that exhausts the treatment chamber to make a negative-pressure atmosphere; an inert gas supply port that faces an opposite side surface opposite to the surface with the fine patterns formed thereon, and supplies inert gas into the treatment chamber; and a nozzle to jet a cleaning solution toward the surface with the fine patterns formed thereon and a gas exhaust port to communicate with the pump, the nozzle and the gas exhaust port being provided on the holding table, wherein the cover is open when the substrate is carried in and out, closed when the substrate is treated, and configured to be capable of sealing the treatment chamber.

A substrate treatment method according to the present invention is a substrate treatment method for cleaning and drying a substrate with fine patterns formed thereon, the substrate treatment method including: a first step of while rotating the substrate so that a surface with the fine patterns formed thereon faces downward, cleaning the substrate by jetting a cleaning solution from below the substrate toward the surface with the fine patterns formed thereon, and shaking off the cleaning solution; and a second step of, in a state that a treatment chamber is sealed and the substrate is held so that the surface with the fine patterns formed thereon faces downward, drying the substrate by heating the substrate from an opposite side surface of the substrate opposite to the surface with the fine patterns formed thereon so that the cleaning solution remaining without being shaken off in the first step evaporates, wherein in the second step, inert gas is supplied from above the substrate toward the opposite side surface of the substrate opposite to the surface with the fine patterns formed thereon, the treatment chamber is exhausted from below the substrate through a gas exhaust port formed at a position facing the surface of the substrate on which the fine patterns are formed so that the treatment chamber has a negative-pressure atmosphere, a droplet formed at an end of the fine patterns by aggregation of the cleaning solution which remains without being shaken off in the first step is guided to be discharged out of a space formed by the droplet and the fine patterns, and the inert gas flows in the order of the opposite side surface of the substrate opposite to the surface with the fine patterns formed thereon, a periphery of the substrate, and the surface of the substrate with the fine patterns formed thereon and is exhausted through the gas exhaust port.

Advantageous Effects of Invention

According to the present invention, the substrate drying treatment is performed in the negative-pressure atmosphere, so that the cleaning solution can be discharged and evaporated easily from the gap between the fine patterns, and thus, the pattern failure on the substrate due to the incomplete drying of the substrate can be prevented. In particular, in the substrate treatment device, not the entire clean room but the inside of the small device, that is, the gas in only the treatment chamber is exhausted to form the negative-pressure atmosphere. Therefore, the substrate cleaning and drying treatment with the smaller size, at lower cost, and in a shorter time can be performed.

BRIEF DESCRIPTION OF DRAWINGS

The following drawings attached in the present specification are to exemplify the preferred embodiment of the present invention and to help the further understanding of the detailed description of the present invention and the technical ideas of the present invention. Therefore, the present invention should not be construed as being limited to the matters illustrated in the drawings.

FIGS. 1a to 1c are cross-sectional diagrams illustrating a conventional process of drying a substrate with fine patterns formed thereon, in which FIG. 1a is a diagram illustrating the whole, FIG. 1b is a diagram illustrating a state before drying, and FIG. 1c is a diagram illustrating a state after the drying.

FIGS. 2a to 2c are cross-sectional diagrams illustrating a process of drying a substrate with fine patterns formed thereon according to the present embodiment, in which FIG. 2a is a diagram illustrating a state under a positive-pressure atmosphere, FIG. 2b is a diagram illustrating a state under a negative-pressure atmosphere, and FIG. 2c is a diagram illustrating a state after the drying.

DESCRIPTION OF EMBODIMENTS

Figure 1A:
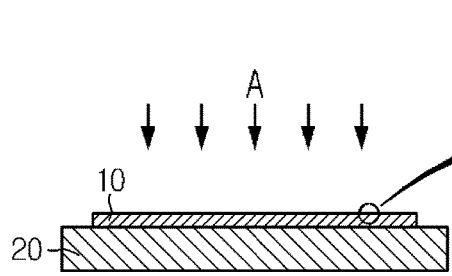

A preferred embodiment of the present invention will hereinafter be described in detail with reference to the attached drawings. Prior to the description, the terms and words used in the present specification and the scope of claims are not construed as being limited to the meanings usually used or defined in the dictionaries, and should be construed based on the meanings and concept according to the technical ideas of the present invention in accordance with the rules that the present inventor himself can define the concept of the terms as appropriate in order to describe the invention in the best way. Therefore, the embodiment described in the present specification and the structures illustrated in the drawings are merely the best embodiment of the present invention, and do not express everything of the technical ideas of the present invention. Thus, it should be understood that various equivalents and modifications that can replace those may exist at the time of the filing of the present application.

In the drawings, the size of each component is not the actual size and may be exaggerated for the convenience of the description and understanding.

Figure 1B:
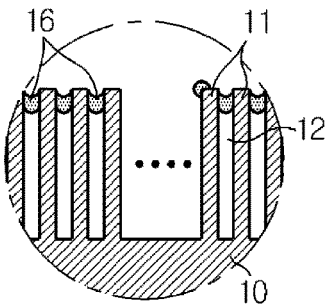
Figure 1C:
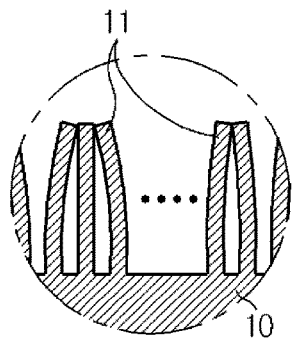
Figure 2A:
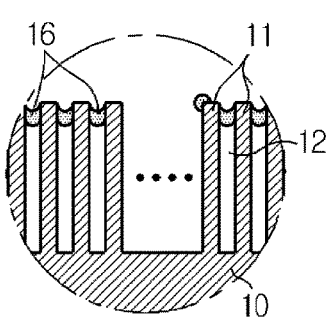
Figure 2B:
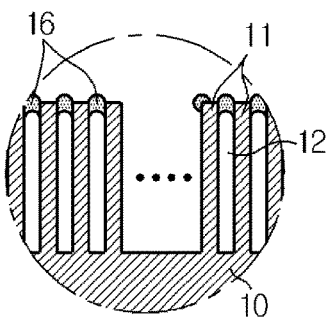
Figure 2C:
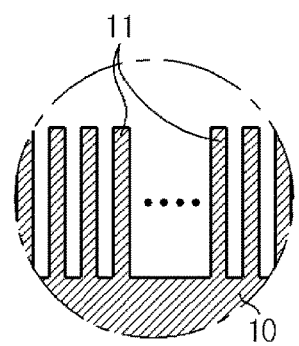

First, an operation of the present embodiment is described with reference to FIGS. 2a to 2c. As described above with reference to FIGS. 1a to 1c, the conventional substrate drying treatment after the substrate cleaning treatment is performed in the clean room with the positive-pressure atmosphere. Therefore, as illustrated in FIG. 2a (FIG. 1b), the cleaning solution that remains without being shaken off from the substrate 10 aggregates at the end of the fine patterns 11 formed on the substrate 10, and forms the droplet 16. The thusly formed droplet 16 has the meniscus shape that is depressed to the inside of the space 12 formed by the droplet 16 and the adjacent fine patterns 11.

In the state illustrated in FIG. 2a, in the present embodiment, the drying treatment for heating the substrate using the heater is performed in a negative-pressure atmosphere (specific means and method for forming the negative-pressure atmosphere will be described below). Then, the atmospheric pressure outside the space 12, that is, the atmospheric pressure in the treatment chamber becomes lower than the atmospheric pressure inside the space 12, and the droplet 16 has the meniscus shape that protrudes to the outside of the space 12 as illustrated in FIG. 2b. Therefore, the droplet 16 of the cleaning solution forms the pendant drop in the space 12, that is, between the fine patterns 11. This can eliminate the stress that operates between the fine patterns 11, thereby enabling the droplet 16 to be easily discharged from the gap and smoothly evaporated. As a result, the fine patterns 11 formed on the dried substrate 10 can maintain the original shape as illustrated in FIG. 2c without being attached to or separated from each other.

Figure 3:
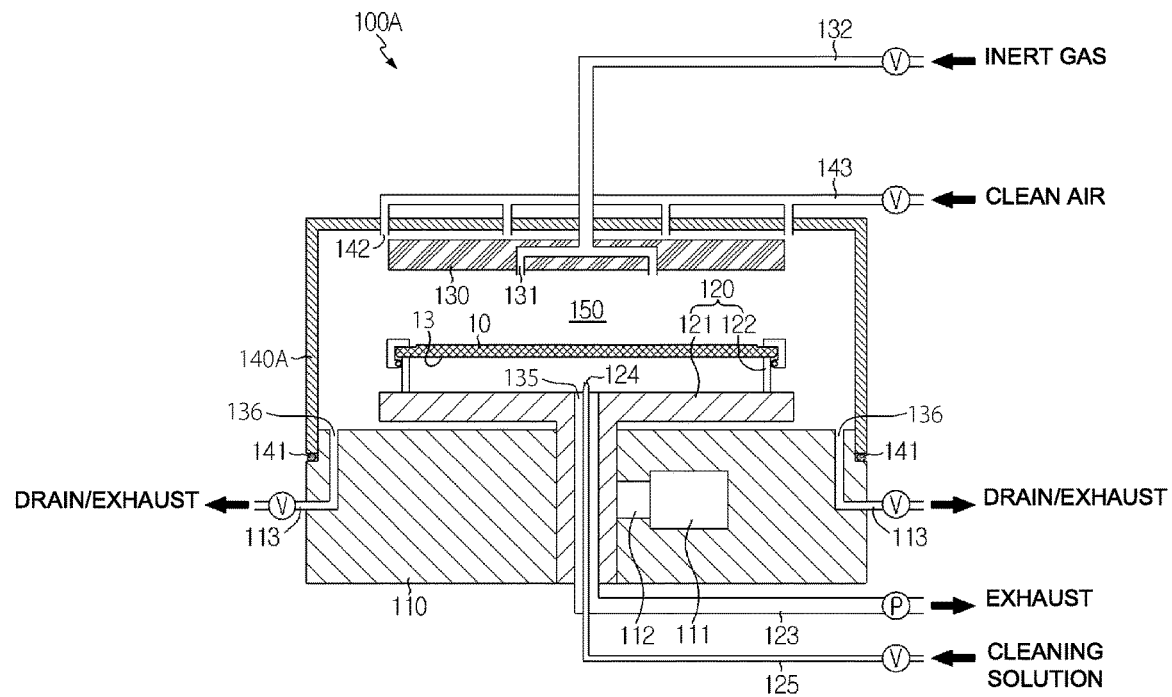
FIG. 3 is a cross-sectional diagram schematically illustrating a substrate treatment device according to the present embodiment.

Next, a substrate treatment device according to a preferred embodiment for embodying the above operation will be described in detail with reference to FIG. 3.

A substrate treatment device 100A according to the present embodiment is an in-situ device performing the cleaning and drying treatment in one device on the substrate 10 with the fine patterns formed thereon. That is to say, the substrate treatment device 100A can perform the drying treatment on the substrate 10 at the place where the cleaning treatment is performed. However, the present invention is not limited thereto and it is needless to say that the present invention is applicable to a drying treatment device where only the drying treatment is performed to which the present operation described above is directly applied, or applicable to a system in which the drying treatment device and a cleaning treatment device for the cleaning treatment are separately provided. In the following description, the substrate 10 is typically a semiconductor wafer; however, it is needless to say that the present invention is also applicable to the treatment for a photomask substrate, a glass substrate for a flat-panel display device, or the like.

The substrate treatment device 100A according to the present embodiment is desirably disposed in the clean room. The substrate treatment device 100 has a cylindrical shape as a whole in accordance with the disc-shaped wafer 10; however, the present invention is not limited by the shape of the whole substrate treatment device. The substrate treatment device 100A includes a base 110, a substrate holding unit 120, a heater 130, and a cover 140A as main components.

The base 110 is a portion that forms a base bottom of the device, and is provided with the substrate holding unit 120, a motor 111, a motive power transmitting device 112, and various kinds of pipes and these will be described below.

The substrate holding unit 120 that holds the substrate 10 holds the substrate 10 in a state that a surface 13 provided with the fine patterns 11 faces downward. The substrate holding unit 120 has a nozzle 124 that jets a cleaning solution to the surface 13 of the substrate 10 on which the fine patterns 11 are formed, and a gas exhaust port 135 that communicates with a pump P.

In the present embodiment, the substrate holding unit 120 includes a plate-shaped holding table 121 with a little larger outer diameter than the outer diameter of the substrate 10, and a plurality of holding pins 122 that is fixed on the holding table 121 in accordance with the outer diameter of the substrate 10 along the outer periphery of the holding table 121. As illustrated in FIG. 3, the substrate 10 is placed on the plurality of holding pins 122 in a state that the surface 13 with the fine patterns 11 formed thereon faces downward. By this placement, the surface 13 of the substrate 10 on which the fine patterns 11 are formed is mounted and held a little apart from an upper surface of the holding table 121.

In the present embodiment, the holding table 121 is rotatable. The base 110 incorporates the motor 111 and the motive force transmitting device 112 that transmits the rotating power of the motor 111 to the holding table 121 after changing the rotating speed and/or the rotating direction of the rotating power. In addition, the holding pins 122 that rotate together with the rotation of the holding table 121 are configured to be able to clamp and fix the outer periphery of the substrate 10 in order to hold and fix the substrate 10 stably.

The holding table 121 is provided with the gas exhaust port 135 for exhausting the gas in a treatment chamber 150. The gas exhaust port 135 communicates with the pump P through a gas exhaust pipe 123. At the gas exhaust pipe 123, a nozzle 124 that jets various kinds of cleaning solutions to the surface 13 of the substrate 10 on which the fine patterns 11 are formed is disposed to communicate with a cleaning solution supply pipe 125 and necessary valve V and/or pump. In the present embodiment, the gas exhaust port 135 is formed at the center of the holding table 121; however, the gas exhaust port 135 is not necessarily formed at the center of the holding table 121 and a plurality of gas exhaust ports may be formed at a plurality of positions of the holding table 121, for example, in a concentric-circular shape or a grid pattern. The gas exhaust port 135 may be formed at a predetermined position of the base 110 instead of being provided on the holding table 121.

On the upper surface of the base 110, a drain port 136 is formed. The drain port 136 collects the liquid-form or spray-form cleaning solution that is jetted and supplied by the nozzle 124. The drain port 136 communicates with the necessary valve V and/or pump through a drain pipe 113. In addition to the gas exhaust port 135, the drain port 136 can exhaust not just the cleaning solution but also the gas inside the treatment chamber 150.

The heater 130 is used to heat the substrate 10 in the treatment for the substrate 10. The heater 130 is provided above the substrate holding unit 120 so as to face an opposite side surface, which is opposite to the surface 13 of the substrate 10 on which the fine patterns 11 are formed. The heater 130 can have a number of heat sources such as halogen lamps in the array shape at the bottom. When the heat sources are arranged in the array shape, it is desirable that a number of heat sources can be controlled to be turned on/off either individually or in a group or the amount of heat generation can be controlled. It is desirable that the heater 130 is vertically movable so that the distance to the substrate 10 can be adjusted.

The heater 130 has an inert gas supply port 131 that supplies inert gas such as nitrogen or argon when the dry treatment is performed on the substrate 10 which will be described below. The inert gas supply port 131 communicates with an inert gas supply pipe 132 that communicates with the necessary valve V and/or pump through the ceiling of the cover 140A to be described below. The inert gas supply port 131 is not necessarily provided on the heater 130, and may alternatively be formed penetrating through the side wall or the ceiling of the cover 140A to be described below.

The cover 140A is to house the substrate holding unit 120 and the heater 130 inside and to form the treatment chamber 150, and is detachably attached to the base 110 through sealing means 141 such as an O-ring along the outer periphery of the base 110. For example, the cover 140A is moved vertically by a driving mechanism, which is not illustrated, so that the cover 140A is opened when the substrate 10 is carried into or out of the treatment chamber 150 and closed to seal the treatment chamber 150 when the substrate 10 is treated.

The cover 140A is provided with a clean air supply port 142 penetrating the ceiling or the side wall. The clean air supply port 142 supplies the clean air to the inside of the treatment chamber 150. The clean air supply port 142 communicates with a clean air supply pipe 143 that communicates with the necessary valve V and/or fan (FAN). The clean air supply pipe 143 supplies the clean air which is usually filtered by a filter such as a HEPA filter and supplied to the clean room.

Next, with reference to FIG. 4 to FIG. 7, description is made of a substrate treatment method according to the present embodiment by describing the process of treating the substrate 10 using the substrate treatment device 100A according to the embodiment described above.

Figure 4:
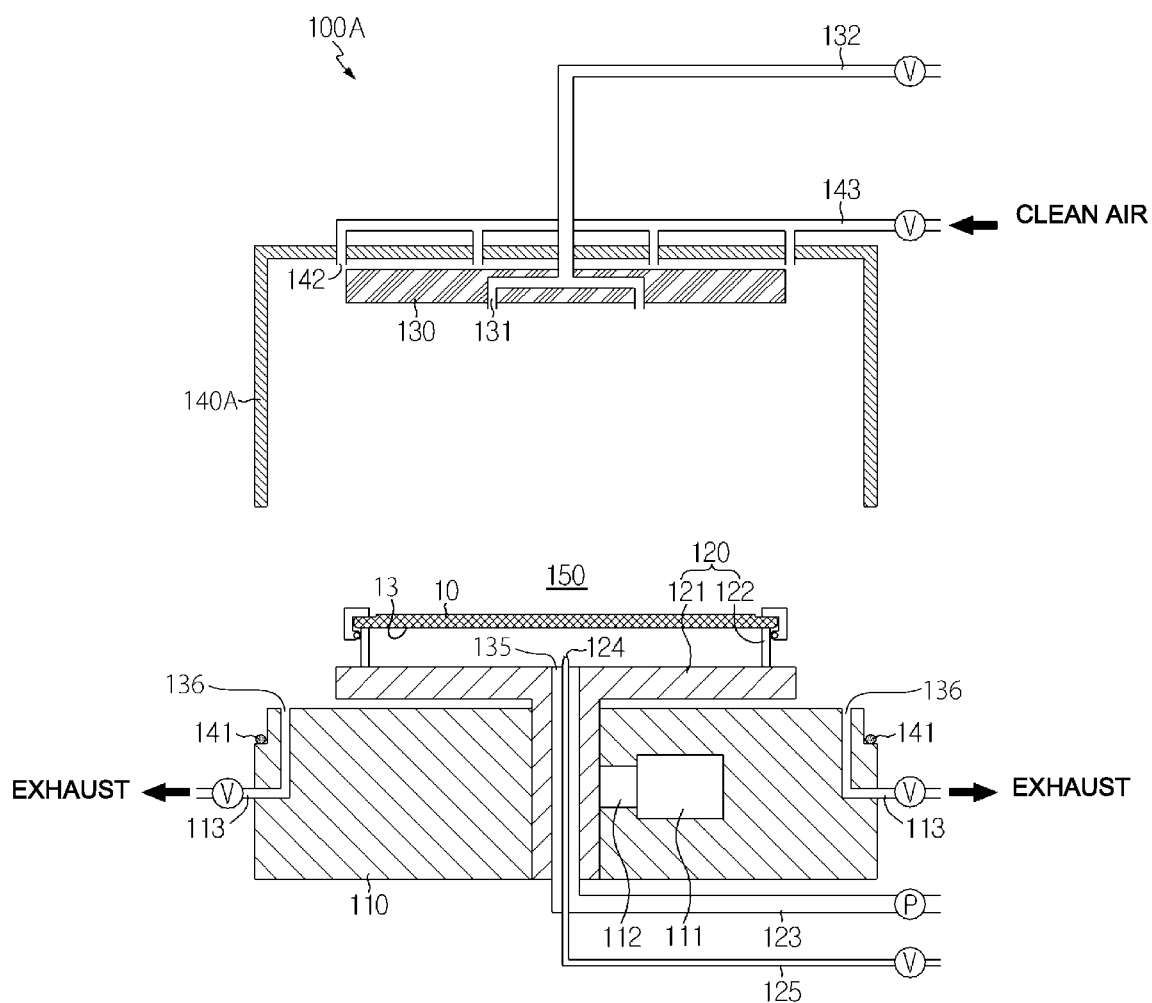
FIG. 4 is a cross-sectional diagram illustrating a process of cleaning and drying a substrate using the substrate treatment device illustrated in FIG. 3.

First, the substrate 10 to be cleaned and dried is carried into the substrate treatment device 100A. For this purpose, as illustrated in FIG. 4, the heater 130 and the cover 140A are lifted up by the driving mechanism, which is not illustrated, and with the use of transporting means such as a robot arm that is not illustrated, the substrate 10 is loaded and fixed to the holding pins 122 in a state that the surface 13 with the fine pattern 11 formed thereon faces downward. When the substrate 10 is carried into the substrate treatment device 100A, the valve V of the clean air supply pipe 143 and the valve V of the drain pipe 113 are open. The valves V of the other gas exhaust pipe 123 and pipes 125 and 132 are closed. After that, the clean air supply pipe 143 is always open, and the valve V of the drain pipe 113 is open except in the dry treatment process to be described below.

Figure 5:
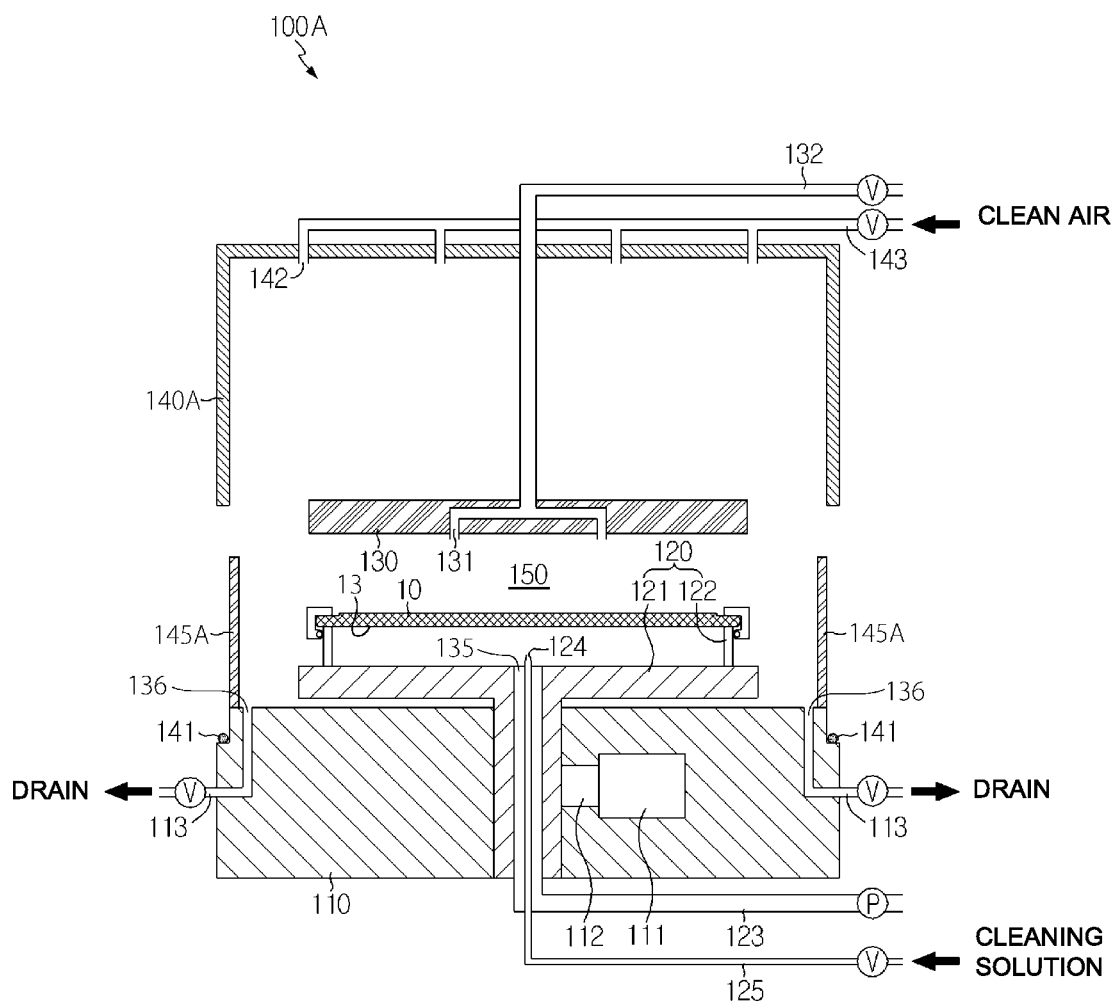
FIG. 5 is a cross-sectional diagram illustrating a process of cleaning and drying the substrate using the substrate treatment device illustrated in FIG. 3.

Next, as illustrated in FIG. 5, a guide wall 145A is formed along an outer periphery of an upper surface of the base 110. The guide wall 145A is a cylindrical member with its top and bottom open, and is capable of preventing the cleaning solution, which is supplied from the nozzle 124 while the substrate holding unit 120 rotates, from scattering out of the substrate treatment device 100A due to the centrifugal force.

In the present embodiment, as illustrated in FIG. 5, the cleaning treatment is performed in a state that the cover 140A is open; however, the cleaning treatment can be performed in a state that the cover 140A is lifted down to seal the treatment chamber 150. In the case of performing the cleaning treatment in a state that the treatment chamber 150 is sealed, the guide wall 145A is not necessary.

Next, while the substrate 10 fixed to the holding pins 122 is rotated by driving the motor 111 to rotate the holding table 121, the valve V of the cleaning solution supply pipe 125 is opened to jet the cleaning solution toward the surface 13 of the substrate 10 on which the fine patterns 11 are formed. Then, by the centrifugal force of the rotating substrate 10, the cleaning solution moves to the outer periphery of the substrate 10. Together with the foreign substance on the surface 13 on which the fine patterns 11 are formed, the cleaning solution flows down to the edge of the upper surface of the base 110 outside the substrate 10, or flows down along the guide wall 145A and is discharged to the edge of the upper surface of the base 110. Then, the cleaning solution is discharged out of the substrate treatment device 100A through the drain port 136.

The cleaning solution can be selected from among the various solutions used widely in the semiconductor process in accordance with the kind of foreign substances to be removed from the substrate 10. Examples thereof include APM (SC-1) ($NH_4OH+H_2O_2+H_2O$), HPM (SC-2) ($HCl+H_2O_2+H_2O$), SPM ($H_2SO_4+H_2O_2$), DSP (diluted $H_2SO_4+H_2O_2+HF$), FPM ($HF+H_2O_2$), BHF ($NH_4F+HF+H_2O$), ozone fluorinated acid ($HF+O_3+H_2O$), pure water, and IPA (isopropyl alcohol). The cleaning solutions can be used selectively, repeatedly, alternately, or mixed. In the present specification, the cleaning is the concept including the rinse (rinsing).

Some cleaning solutions can be used in the cleaning treatment in which the substrate 10 is heated using the heater 130. In order to perform the cleaning treatment while the substrate 10 is heated, the heater 130 is lifted down to come close to the substrate 10 as illustrated in FIG. 5.

Figure 6:
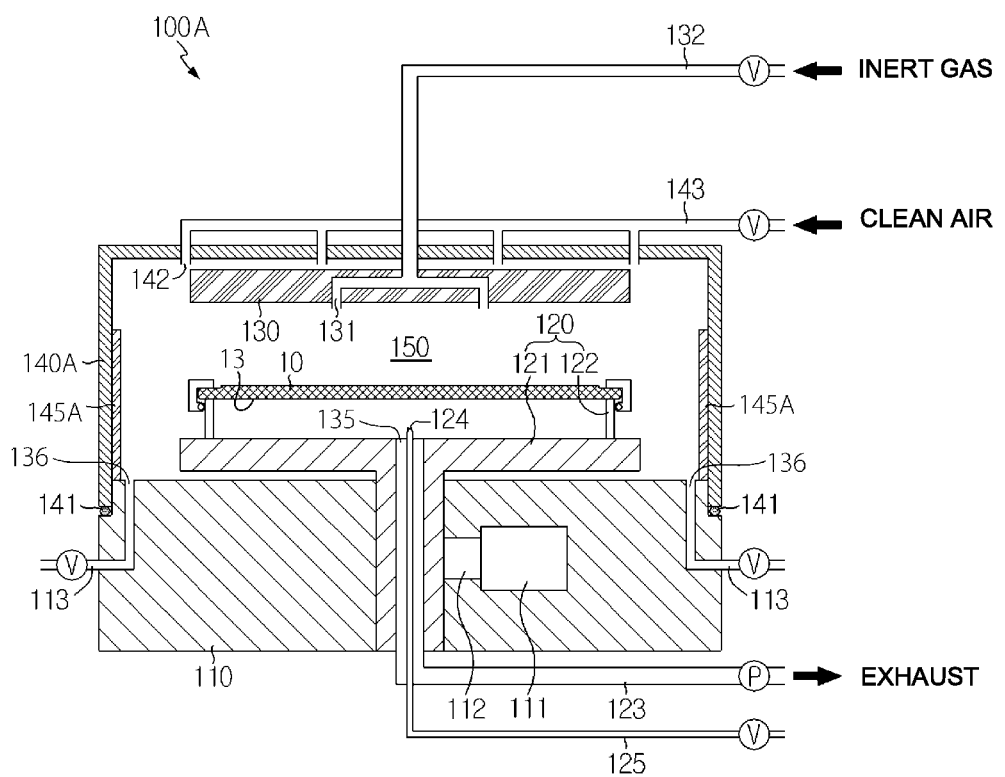
FIG. 6 is a cross-sectional diagram illustrating a process of cleaning and drying the substrate using the substrate treatment device illustrated in FIG. 3.
Figure 7:
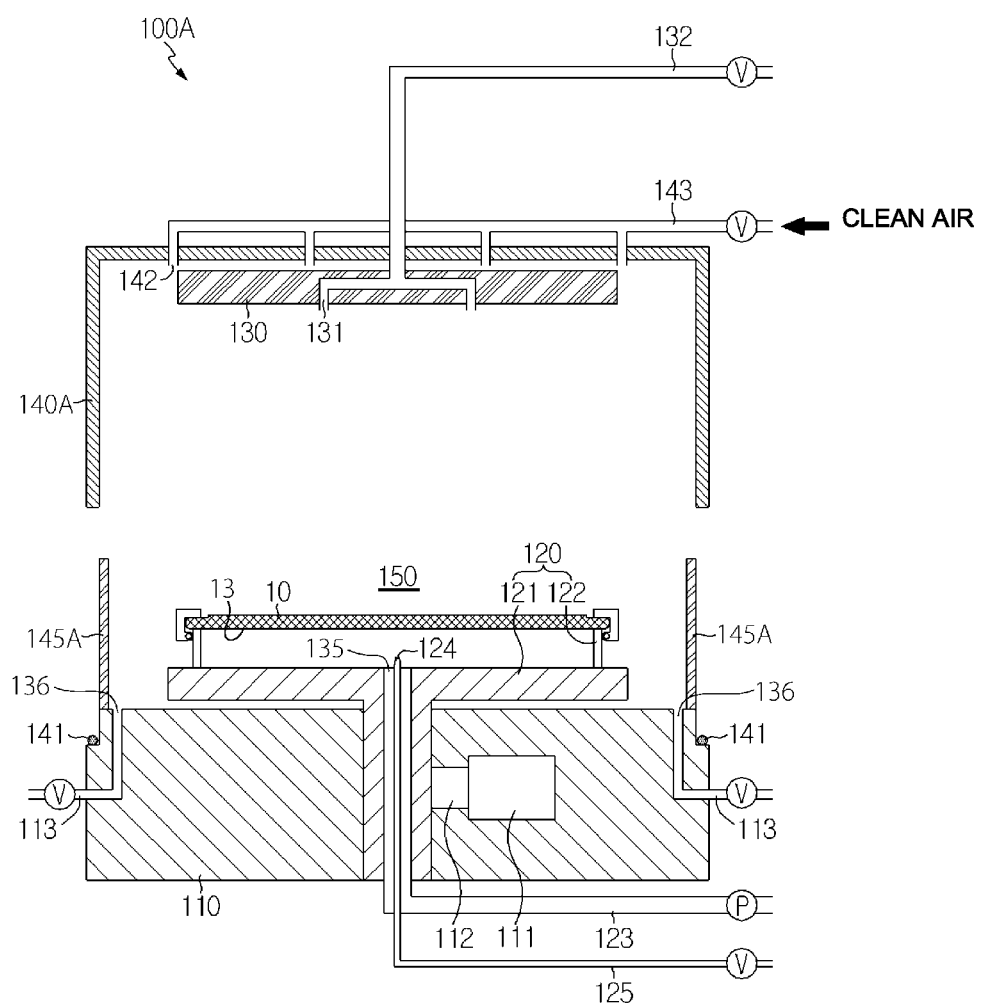
FIG. 7 is a cross-sectional diagram illustrating a process of cleaning and drying the substrate using the substrate treatment device illustrated in FIG. 3.

Next, as illustrated in FIG. 6, the cover 140A is lifted down to seal the treatment chamber 150. In FIG. 6, the cover 140A is lifted down while the guide wall 145 remains the same; however, the cover 140A may be lifted down after the guide wall 145A is removed.

Next, IPA is jetted through the cleaning solution jetting nozzle 124. IPA is a solvent to dissolve the residue of the cleaning solution, impurities, and the like, and has a property of easily evaporating without drying unevenness; therefore, IPA has been widely used in the cleaning and drying treatment for the substrate. It is desirable that the heater 130 is not in operation while IPA is jetted; however, the operation stop of the heater 130 is not essential. The substrate holding unit 120 is continuously rotated.

Next, the regular drying treatment for the substrate 10 is performed. Specifically, inert gas such as nitrogen or argon is supplied from the inert gas supply port 131 while the substrate 10 is heated by operating the heater 130, and at the same time, the pump P of the gas exhaust pipe 123 is operated to exhaust the treatment chamber 150. This makes the treatment chamber 150 have a negative-pressure atmosphere. While the substrate 10 is subjected to the regular drying treatment, the substrate holding unit 120 may be continuously rotated and the clean air may be continuously supplied from the clean air supply port 142. The valve V of the drain pipe 113 is closed to prevent the inert gas supplied into the treatment chamber 150 from escaping through the drain port 136. Therefore, the inert gas supplied through the inert gas supply port 131 goes along the outer periphery of the substrate 10 through the space between the lower surface of the substrate 10, that is, the surface on which the fine patterns 11 are formed, and the upper surface of the holding table 121 and is exhausted from the gas exhaust port 135.

Then, as described with reference to FIGS. 2a to 2c, the droplet 16 of the cleaning solution (IPA) aggregating at the end of the fine patterns 11 comes to have the meniscus shape protruding out of the space 12 (see FIG. 2(b)), is discharged from the gap between the fine patterns 11, and evaporates.

In the drying treatment, it is desirable that the exhausting amount of the pump P relative to the amount of supplying the inert gas and the clean air is adjusted and/or the heating degree of the heater 130 is adjusted so that the treatment chamber 150 has the appropriate negative-pressure atmosphere. That is to say, if the exhausting amount of the pump P relative to the amount of supplying the inert gas and the clean air is small, the desired negative-pressure atmosphere is not formed and the operation of the present embodiment cannot be achieved. On the contrary, if the exhausting amount of the pump is too large or the heating by the heater is excessive, the pressure difference between the inside of the space 12 and the treatment chamber 150 becomes too large. This may cause the following side-effect, for example: the droplets 16 scatter while bursting to leave a foreign substance in the space 12, or the droplets 16 are dried with unevenness on the surface of the substrate 10.

After a predetermined time has passed and the cleaning solution (IPA) has evaporated entirely to complete the drying of the substrate 10, the heater 130 is stopped and the pump P is stopped to stop the exhausting from the gas exhaust port 135. Then, the valve V of the inert gas supply pipe 132 is closed to stop the supply of the inert gas.

Next, when the temperature and the pressure in the treatment chamber 150 have returned to the normal temperature and the normal pressure, the heater 130 and the cover 140A are lifted up to open the treatment chamber 150, and then, the guide wall 145A is removed and through the transporting means such as a robot arm, the substrate 10 is extracted out of the substrate treatment device 100A.

In the substrate treatment device 100A according to the present embodiment described above, when the substrate 10 is cleaned, the cleaning solution is jetted toward the surface 13 of the substrate 10 on which the fine patterns 11 are formed through the nozzle 124 while the substrate 10 held by the substrate holding unit 120 is rotated, and when the cleaned substrate 10 is dried, the heater 130 is operated to heat the substrate 10 from the opposite side surface, which is opposite to the surface 13 with the fine patterns 11 formed thereon and at the same time, the inert gas is supplied toward the opposite side surface of the surface 13 of the substrate 10 on which the fine patterns 11 are formed through the inert gas supply port 131 and additionally, the pump P is operated to exhaust the inert gas so that the treatment chamber 150 has the negative-pressure atmosphere. Thus, the inert gas flows in the order of the opposite side surface of the surface 13 with the fine patterns 11 formed thereon, the periphery of the substrate 10, and the central part of the surface 13 of the substrate 10 on which the fine patterns 11 are formed and then is exhausted through the gas exhaust port 135.

In the substrate treatment method and the substrate treatment device 100A according to the present embodiment, by performing the drying treatment on the substrate 10 in the negative-pressure atmosphere, the cleaning solution can be discharged and evaporated easily from the gap between the fine patterns 11, and the failure that the fine patterns 11 are attracted to or separated from each other can be remarkably reduced. In particular, by the use of the substrate treatment device 100A according to the present embodiment, not the entire clean room but the inside the small substrate treatment device 100A, that is, only the gas in the treatment chamber 150 is exhausted to form the negative-pressure atmosphere. This eliminates the necessity of using the large-capacity vacuum pump, so that the negative-pressure atmosphere can be formed at lower cost and in a shorter time.

By the device and method according to the present embodiment, the cleaning and drying treatment is performed in a state that the surface 13 of the substrate 10 on which the fine patterns 11 are formed faces downward; therefore, the cleaning solution or the foreign substance is discharged easily without being held in the gap between the fine patterns 11. In particular, the clean air supplied from the ceiling of the clean room flows downward, so that the foreign substance in the treatment chamber 150 easily adheres to the upper surface of the substrate 10. In consideration of this point, it is very effective to make the surface 13 on which the fine patterns 11 are formed face downward in order to prevent the drying failure.

The substrate treatment device 100A has the gas exhaust port 135 in the holding table 121; therefore, the inert gas flows in the order of the opposite side surface of the substrate 10, which is opposite to the surface 13 with the fine patterns 11 formed thereon, the periphery of the substrate 10, and the surface 13 of the substrate 10 on which the fine patterns 11 are formed and then is exhausted through the gas exhaust port 135. The substrate treatment device 100A with the structure as above lets the inert gas efficiently pass the surface 13 of the substrate 10 on which the fine patterns 11 are formed. Therefore, the substrate 10 can be dried completely in a short time.

In addition, since the gas exhaust port 135 is provided at the center of the holding table 121 in the substrate treatment device 100A, the inert gas passes in the order from the periphery of the substrate 10 to the central part of the surface 13 of the substrate 10 on which the fine patterns 11 are formed and then is exhausted through the gas exhaust port 135. Therefore, the inert gas can pass the surface 13 of the substrate 10 on which the fine patterns 11 are formed more efficiently.

According to the present embodiment, the cleaning treatment and the drying treatment for the substrate 10 are performed in-situ in one device; therefore, the treatment efficiency is high and the contamination of the substrate 10 that occurs in the process of transfer between the cleaning device and the drying device can be prevented.

Figure 8:
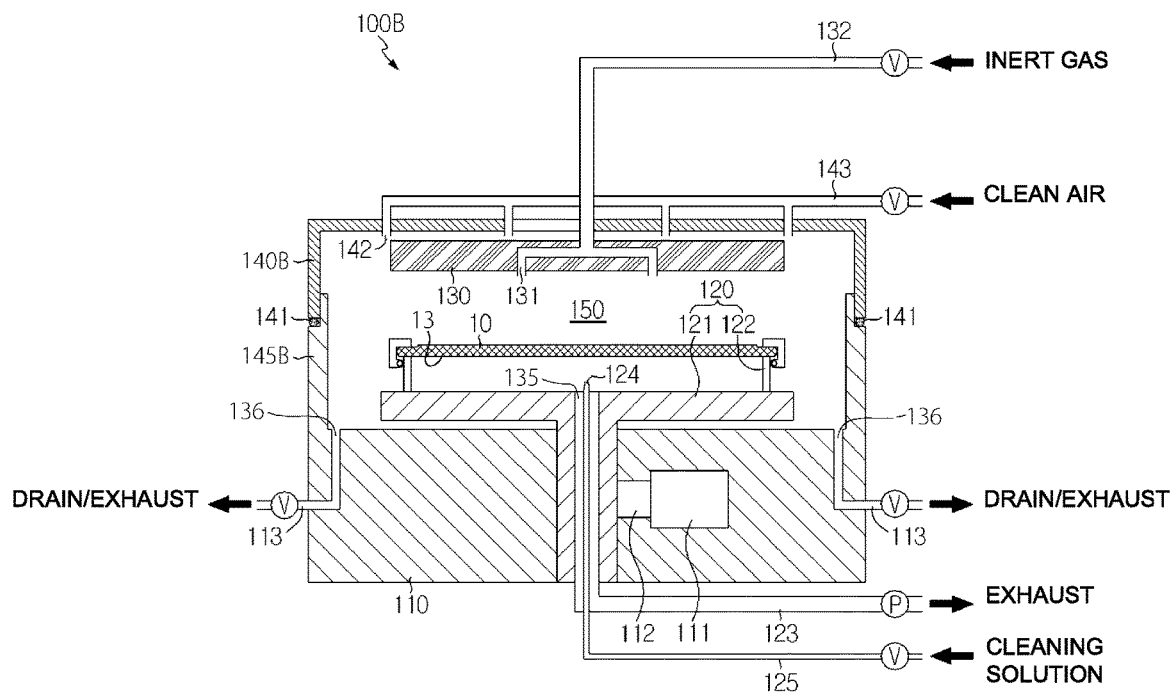
FIG. 8 is a cross-sectional diagram illustrating a modification of the substrate treatment device illustrated in FIG. 3.

The device and the process in the above embodiment can be variously modified. For example, the guide wall 145A for preventing the cleaning solution from scattering out of the device in the cleaning treatment for the substrate 10 (see FIG. 5 to FIG. 7) may be formed as an integrated guide wall 145B extending upward from the outer periphery of the base 110 as illustrated in FIG. 8. The substrate treatment device 100B can save the trouble of installing and removing the separately provided guide wall 145A of the above embodiment, and the length (height) of the side wall of a cover 140B can be shortened as compared to that of the substrate treatment device 100A illustrated in FIG. 3. Thus, the distance of moving up and down the cover 140B to open/close the treatment chamber 150 can be reduced. When such a moving distance is reduced, it is necessary that at the time of carrying in and out of the substrate 10, the robot arm having entered the treatment chamber 150 over the guide wall 145B can be moved up and down to the holding pins 122 or the substrate holding unit 120 can be moved up.

In addition, in the above embodiment, the covers 140A and 140B are attached to and detached from the base 110 by the vertical movement; however, the detachable structure of the cover for the base can be changed. For example, the covers 140A and 140B may have one side rotatably fixed to one side of the base 110, and by rotating the cover, the cover can be attached to and detached from the base.

In addition, various characteristics (structure and process) described in the above embodiment can be selected and combined arbitrarily unless departing from or contradicting to the concept of the present invention. For example, the structure in which the surface of the substrate on which with the fine patterns are formed faces downward, the structure in which the substrate holding unit is rotated, the structure in which the inert gas or the clean air is supplied, opening/closing of various pipes in each process, opening/closing of the gas exhaust port and the drain port, and the like can be omitted or changed as necessary.

The present invention has been described with reference to the limited embodiment and drawings; however, the present invention is not limited thereto and it is needless to say that various modifications and changes can be made by an ordinary person skilled in the technical field to which the present invention belongs within the technical ideas and the equivalent range of the scope of claims in the present invention.

REFERENCE SIGNS LIST

10 SUBSTRATE
11 FINE PATTERN
12 SPACE
16 DROPLET
100A, 100B SUBSTRATE TREATMENT DEVICE
110 BASE
111 MOTOR
112 MOTIVE POWER TRANSMITTING DEVICE
113 DRAIN PIPE
120 SUBSTRATE HOLDING UNIT
121 HOLDING TABLE
122 HOLDING PIN
123 GAS EXHAUST PIPE
124 NOZZLE
125 CLEANING SOLUTION SUPPLY PIPE
130 HEATER
131 INERT GAS SUPPLY PORT
132 INERT GAS SUPPLY PIPE
135 GAS EXHAUST PORT
136 DRAIN PORT
140A, 140B COVER
141 SEALING MEANS
142 CLEAN AIR SUPPLY PORT
143 CLEAN AIR SUPPLY PIPE
145A, 145B GUIDE WALL
150 TREATMENT CHAMBER

The invention claimed is:

1. A substrate treatment device for cleaning and drying a substrate with fine patterns formed thereon, the substrate treatment device comprising:
a substrate holding unit including a plate-shaped holding table that rotatably holds the substrate so that a surface of the substrate with the fine patterns formed thereon faces downward, and a plurality of holding pins provided on the holding table to hold an outer periphery of the substrate at a plurality of points;
a heater that heats the substrate disposed so that a distance between the heater and the substrate can be adjusted;
a cover that internally houses the substrate holding unit and the heater, and constitutes a treatment chamber;
a pump that exhausts the treatment chamber to make a negative-pressure atmosphere;
an inert gas supply port that faces an opposite side surface opposite to the surface with the fine patterns formed thereon, and supplies inert gas into the treatment chamber; and
a nozzle to jet a cleaning solution toward the surface with the fine patterns formed thereon and a gas exhaust port to communicate with the pump, the nozzle and the gas exhaust port being provided on the holding table, wherein
the cover is open when the substrate is carried in and out, closed when the substrate is treated, and configured to be capable of sealing the treatment chamber.

2. The substrate treatment device according to claim 1, wherein the nozzle and the gas exhaust port are provided at a center of the holding table.

3. The substrate treatment device according to claim 1, wherein the heater is provided above the substrate holding unit so as to face the opposite side surface of the substrate opposite to the surface with the fine patterns formed thereon.

4. The substrate treatment device according to claim 3, wherein the heater is disposed so that the heater is vertically movable by a driving mechanism.

5. The substrate treatment device according to claim 1, wherein a drain port to drain the cleaning solution jetted from the nozzle is provided.

6. The substrate treatment device according to claim 1, wherein the substrate holding unit is rotatable.

7. The substrate treatment device according to claim 1, wherein the inert gas supply port is formed penetrating a ceiling of the cover.

8. The substrate treatment device according to claim 1, wherein a clean air supply port to supply clean air in the treatment chamber is provided.

9. The substrate treatment device according to claim 8, wherein the clean air supply port is provided penetrating the ceiling of the cover.

10. A substrate treatment method for cleaning and drying a substrate with fine patterns formed thereon, the substrate treatment method comprising:
a first step of while rotating the substrate so that a surface with the fine patterns formed thereon faces downward, cleaning the substrate by jetting a cleaning solution from below the substrate toward the surface with the fine patterns formed thereon, and shaking off the cleaning solution; and
a second step of, in a state that a treatment chamber is sealed and the substrate is held so that the surface with the fine patterns formed thereon faces downward, drying the substrate by heating the substrate by a heater disposed so that a distance between the heater and the substrate can be adjusted from an opposite side surface of the substrate opposite to the surface with the fine patterns formed thereon so that the cleaning solution remaining without being shaken off in the first step evaporates, wherein
in the second step, inert gas is supplied from above the substrate toward the opposite side surface of the substrate opposite to the surface with the fine patterns formed thereon, the treatment chamber is exhausted from below the substrate through a gas exhaust port formed at a position facing the surface of the substrate with the fine patterns formed thereon so that the treatment chamber has a negative-pressure atmosphere, a droplet formed at an end of the fine patterns by aggregation of the cleaning solution which remains without being shaken off in the first step is guided to be discharged out of a space formed by the droplet and the fine patterns, and the inert gas flows in the order of the opposite side surface of the substrate opposite to the surface with the fine patterns formed thereon, a periphery of the substrate, and the surface of the substrate with the fine patterns formed thereon and is exhausted through the gas exhaust port.

11. The substrate treatment method according to claim 10, wherein the first step and the second step are performed in-situ.

12. The substrate treatment method according to claim 10, wherein:

the gas exhaust port is formed at a position facing a central part of the surface of the substrate with the fine patterns formed thereon; and the droplet is discharged through the gas exhaust port passing the opposite side surface of the substrate opposite to the surface with the fine patterns formed thereon, a periphery of the substrate, and the central part of the surface of the substrate with the fine patterns formed thereon in this order.

* * * * *